United States Patent

Wimpenny

(10) Patent No.: US 9,491,314 B2
(45) Date of Patent: Nov. 8, 2016

(54) VOLTAGE BOOST FOR ET MODULATOR

(71) Applicant: SNAPTRACK, INC., San Diego, CA (US)

(72) Inventor: Gerard Wimpenny, Cambridgeshire (GB)

(73) Assignee: SNAPTRACK, INC., San Diego, CA (US)

(*) Notice: Subject to any disclaimer, the term of this patent is extended or adjusted under 35 U.S.C. 154(b) by 0 days.

(21) Appl. No.: 14/764,895

(22) PCT Filed: Jan. 31, 2014

(86) PCT No.: PCT/EP2014/051962
§ 371 (c)(1),
(2) Date: Jul. 30, 2015

(87) PCT Pub. No.: WO2014/118342
PCT Pub. Date: Aug. 7, 2014

(65) Prior Publication Data
US 2015/0358486 A1    Dec. 10, 2015

(30) Foreign Application Priority Data

Feb. 1, 2013 (GB) .................................. 1301854.4

(51) Int. Cl.
H04M 19/08 (2006.01)
H03F 1/02 (2006.01)
(Continued)

(52) U.S. Cl.
CPC ............... *H04M 19/08* (2013.01); *H02M 3/07* (2013.01); *H03F 1/0211* (2013.01);
(Continued)

(58) Field of Classification Search
CPC .............................. H03F 1/0211; H03F 1/30

USPC ................................ 330/127, 297, 296, 285
See application file for complete search history.

(56) References Cited

U.S. PATENT DOCUMENTS 7,714,660 B2* 5/2010 Lesso ..................... H02M 3/07
330/127
9,385,605 B2* 7/2016 Wilson ............... H02M 3/1582
(Continued)

FOREIGN PATENT DOCUMENTS

WO    2008082582 A1    7/2008

OTHER PUBLICATIONS

International Search Report and Written Opinion—PCT/EP2014/051962—ISA/EPO—Dec. 19, 2014.

*Primary Examiner* — Henry Choe

(57) ABSTRACT

There is disclosed a voltage supply stage comprising an input supply voltage, a first (102) and second (104) switch connected in series, the first (102) and second (104) series-connected switches being connected in parallel with the input supply voltage between first and second terminals of the input supply voltage, a third (106) switch and capacitor connected in series, the series-connected third (106) switch and capacitor being connected in parallel with the first (102) switch, a fourth (108) switch connected between the connection of the third switch and the capacitor and an output, and a fifth (110) switch connected between the output and a terminal of the input supply voltage, wherein: in a first phase of operation, the first and the fourth switch are closed, and the second, third and fifth switches are open; in a second phase of operation, the second, third and fifth switches are closed, and the first and fourth switches are open; and the duty cycle of the first and second phases is controlled such that the average voltage on the output varies between 0 volts and twice the input supply voltage.

14 Claims, 8 Drawing Sheets

(51) Int. Cl.
*H03F 3/19* (2006.01)
*H02M 3/07* (2006.01)
*H03F 3/217* (2006.01)
*H02M 1/00* (2006.01)

(52) U.S. Cl.
CPC ............ *H03F 1/0227* (2013.01); *H03F 3/19* (2013.01); *H03F 3/217* (2013.01); *H02M 2001/0045* (2013.01); *H03F 2200/102* (2013.01); *H03F 2200/451* (2013.01)

(56) References Cited

U.S. PATENT DOCUMENTS

| | | | |
|---|---|---|---|
| 2002/0030543 A1* | 3/2002 | French | H03F 1/0227 330/297 |
| 2009/0309658 A1* | 12/2009 | Mendenhall | H03F 3/217 330/251 |
| 2013/0241660 A1* | 9/2013 | Midya | H03F 1/0227 330/297 |

* cited by examiner

VOLTAGE BOOST FOR ET MODULATOR

BACKGROUND TO THE INVENTION

Field of the Invention

The invention relates to envelope tracking modulated power supplies suitable for radio frequency power amplifier applications. The invention is particularly concerned with such power supplies in which a reference signal is used as an input to a low frequency path and a high frequency path, and in which each path generates separate outputs which are combined to form a supply voltage.

Description of the Related Art

Envelope tracking power supplies for radio frequency power amplifiers are well-known in the art. Typically a reference signal is generated based on an envelope of an input signal to be amplified. A envelope tracking power supply generates a supply voltage for the power amplifier which tracks the reference signal.

FIG. 1 shows a prior art envelope tracking (ET) modulator architecture in which a frequency splitter 12 is used to divide an incoming envelope reference signal on line 10 into a high frequency (HF) path signal on line 14 and a low frequency (LF) path signal on line 16. The frequency splitter 12 may include a low pass filter 18 in the low frequency path and a high pass filter 20 in the high frequency path. The signal in the LF path on line 16 is amplified by an efficient switched mode amplifier 22, and the signal in the HF path on line 14 is amplified by a wideband linear amplifier 24. A frequency selective combiner 26 is used to combine the signals in the LF and HF paths after amplification. In FIG. 1 the combiner 26 is illustrated as including a low frequency combining element 28 in the low frequency path, and a high frequency combining element 30 in the high frequency path. A combined signal from the combiner 26 on line 32 provides a feed to a load 34, which in a typical application is a power amplifier (PA). Typically the reference signal is also derived from an input signal to be amplified by the power amplifier.

An example of a power amplifier system incorporating a supply architecture such as illustrated in FIG. 1 can be found on "Band Separation and Efficiency Optimisation in Linear-Assisted Switching Power Amplifiers", Yousefzadeh et al, [IEEE Power Electronics Specialists Conference 2006].

FIG. 2 shows an alternative prior art arrangement in which the frequency selective combiner 26 is an inductor-capacitor (LC) combiner. The low frequency combining element is an inductor 28a, and the high frequency combining element is a capacitor 30a. In this arrangement a feedback path 36 takes a signal from the combiner (or modulator) output on line 32, to the input of the linear amplifier 24. The signal on the feedback path 36 is subtracted from the signal in the high frequency path on line 14 by subtractor 38, to provide an input to the linear amplifier 24. The inclusion of the feedback path 36 achieves improved tracking accuracy compared to the arrangement of FIG. 1.

An example of a power amplifier system incorporating a supply architecture such as illustrated in FIG. 2 can be found in "Efficiency Optimisation in Linear-Assisted Switching Power Converters for Envelope Tracking in RF Power Amplifiers", Yousefzadeh et al, [IEEE Symposium on Circuits and Systems 2005].

Boost and Buck-Boost converters which allow the output of the supply to be higher than the input voltage (e.g. a battery voltage) are known in the art. However most known boost techniques result in the converter having low bandwidth, and also result in an output signal with high levels of wideband noise.

It is an aim of the invention to provide an envelope tracking modulated power supply incorporating an improved voltage boost scheme.

SUMMARY OF THE INVENTION

There is provided a voltage supply stage comprising an input supply voltage, a first (102) and second (104) switch connected in series, the first (102) and second (104)series-connected switches being connected in parallel with the input supply voltage between first and second terminals of the input supply voltage, a third (106) switch and capacitor connected in series, the series-connected third (106) switch and capacitor being connected in parallel with the first (102) switch, a fourth (108) switch connected between the connection of the third switch and the capacitor and an output, and a fifth (110) switch connected between the output and a terminal of the input supply voltage, wherein: in a first phase of operation, the first and the fourth switch are closed, and the second, third and fifth switches are open; in a second phase of operation, the second, third and fifth switches are closed, and the first and fourth switches are open; and the duty cycle of the first and second phases is controlled such that the average voltage on the output varies between 0 volts and twice the input supply voltage.

The voltage supply stage preferably comprises a peak current mode switcher.

The voltage supply stage may further comprise a sixth switch (118) connected between the connection of the third (106) switch and the capacitor a further output, and a seventh (116) switch connected between the further output and the terminal of the input supply voltage, wherein: in the first phase of operation, the sixth switch is closed and the seventh switch is open; in the second phase of operation, the sixth switch is open and the seventh switch is closed; and the duty cycle of the first and second phases is controlled such that the average voltage on the further output varies between 0 volts and twice the input supply voltage.

The first, second and third switches may be enabled and disabled with the fourth and fifth switches or the sixth and seventh switches.

In a buck only mode of operation the second (104) and third (106) switches are closed and the first (102) switch is opened in both the first and second phases of operation, and the duty cycle of the remaining switches in the first and second phases of operation is controlled such that the average voltage on the output and/or the further output varies between 0 volts and the input supply voltage.

There may be provided a control signal for enabling and disabling the buck mode of operation.

The voltage supply stage may further comprise circuitry for comparing one of the output or the further output or the low frequency reference signal to a threshold level, and setting or resetting the control signal in dependence thereon.

An envelope tracking modulated supply arranged to generate a modulated supply voltage in dependence on a reference signal, comprising a low frequency path for tracking low frequency variations in the reference signal and including a switched mode power supply including a voltage supply stage according to any one of the claims defined, a correction path for tracking high frequency variations in the reference signal and including a linear amplifier, and a combiner for combining the output of the switched mode power supply and the output of the linear amplifier to generate a modulated supply voltage.

There may be provided a feedback path from the output of the linear amplifier to the input of the linear amplifier, such that the linear amplifier in the correction path amplifies a signal comprising the full spectrum of the frequencies in the reference signal.

The output may provide the power supply of the first path. The further output may provide the power supply of the second path.

The first path may comprise a peak current mode switcher.

An RF amplifier may include a voltage supply stage. A wireless communication system may include a voltage supply stage. A wireless mobile device may include a voltage supply stage.

BRIEF DESCRIPTION OF THE FIGURES

The invention is now described by way of example with reference to the accompanying Figures, in which.

DESCRIPTION OF THE PREFERRED EMBODIMENTS

In the following description the invention is described with reference to exemplary embodiments and implementations. The invention is not limited to the specific details of any arrangements as set out, which are provided for the purposes of understanding the invention.

Embodiments of the invention are described in the following description in the context of application to particular feedback architectures for the linear amplifier in the high frequency correction path. The invention and its embodiments are however not necessarily limited to the particular feedback arrangements in the high frequency correction path as shown.

Figure 2:
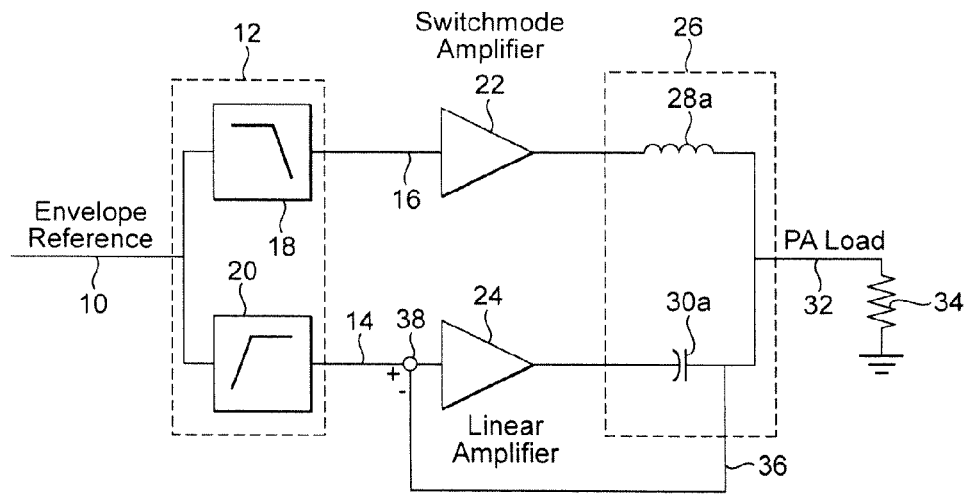
FIG. 2 illustrates a prior art envelope tracking modulated supply incorporating feedback in the high frequency path.
Figure 3:
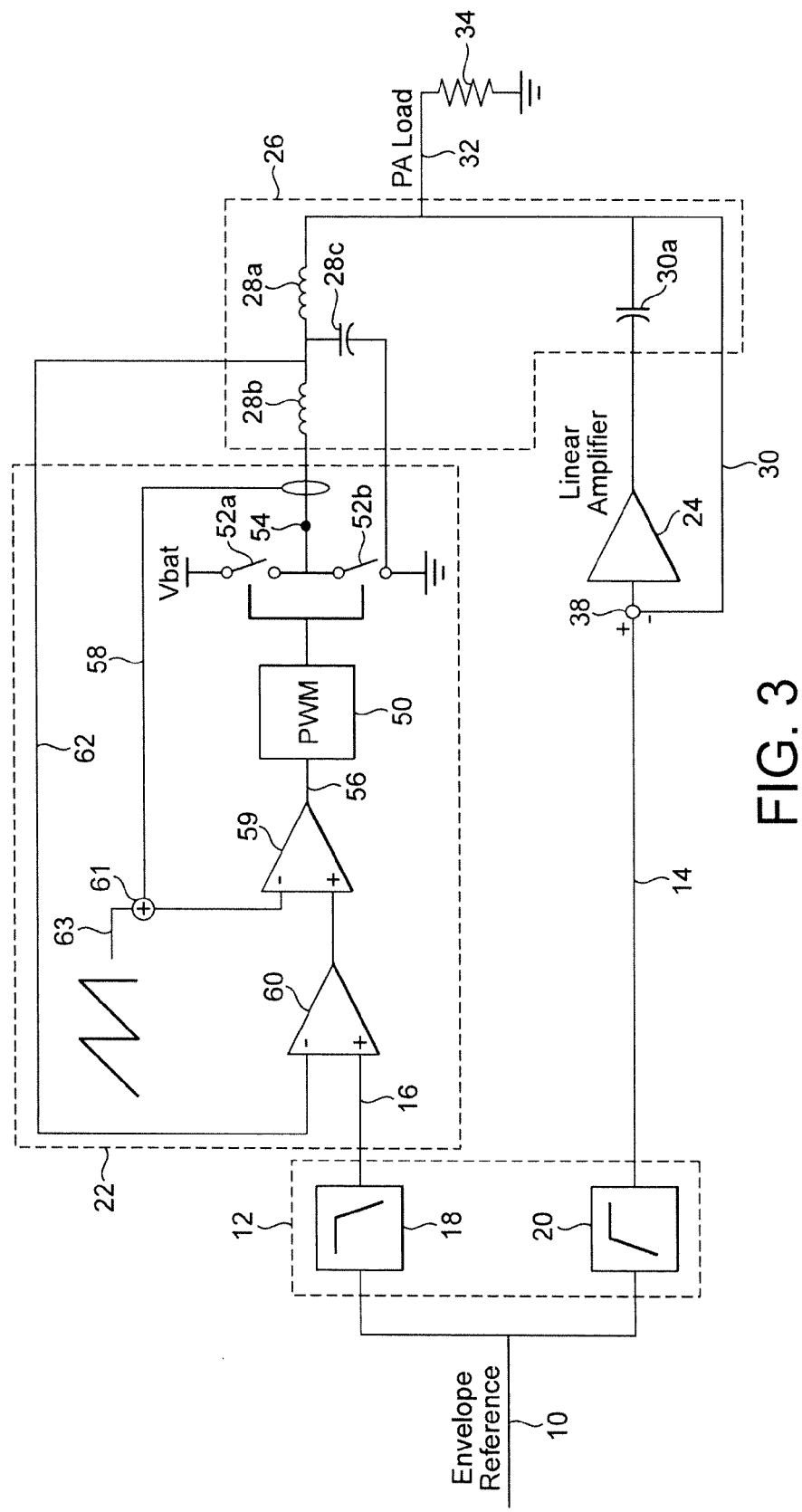
FIG. 3 illustrates an improved envelope tracking modulated supply incorporating feedback in the high frequency path, switcher ripple current elimination in the low frequency path, and a preferred implementation of a switched mode supply, in which embodiments of the invention may be advantageously incorporated.

With reference to FIG. 3 there is illustrated the envelope tracking architecture as illustrated in FIG. 2, with the addition of an exemplary implementation of the switched mode power amplifier 22.

The switched mode amplifier of FIG. 3 preferably also includes an arrangement to address a triangular ripple current which may flow in the inductor 28a as a result of the switching of the switched mode amplifier 22. This ripple current must be shunted through the output stage of the linear amplifier 24 via the capacitor 30a, in order to avoid the creation of unwanted voltage errors at the combiner output and hence on the modulator output. The consequential ripple current flowing through the output of the linear amplifier 24 reduces its efficiency.

FIG. 3 thus shows a preferable arrangement in which the frequency combiner 26 of FIG. 2 is adapted to include an additional capacitor 28c and inductor 28b. The magnitude of the coupling factor between inductors 28a and 28b may range between 0 and 1. The inductor 28b is connected between the output of the switched mode amplifier 22 and the inductor 28a. The capacitor 28c is connected between the common connection of the inductors 28a and 28b and electrical ground.

The ripple current due to the switched mode amplifier 22 now flows in the inductor 28b and is now shunted to ground via the capacitor 28c. The loss associated with the ripple current flowing in inductor 28a and passing through the linear output stage is thus avoided.

As regards the exemplary implementation of the switched mode power amplifier, in a preferred arrangement the LF path switched mode amplifier 22 is preferably implemented as a peak-current-mode buck-converter which is a known prior art technique for implementing high bandwidth switched mode power supplies.

As illustrated in FIG. 3, the switched mode amplifier 22 includes a pulse width modulator (P) 50 which receives a control signal on line 56, and which controls a pair of switches 52a and 52b. Switch 52a is connected between a supply voltage and a common node 54, and switch 52b is connected between the common node and electrical ground. The supply voltage is provided by a battery, and is denoted Vbat. The pulse width modulator 50 controls the switches 52a and 52b to provide the low frequency path output to the combiner 26 in dependence on the control signal on line 56. The arrangement of a pulse width modulator in combination with a switched supply is known in the art.

The switched mode amplifier 22 includes an inner current control feedback loop and an outer voltage control feedback loop.

The inner current control feedback loop senses the inductor current either directly or indirectly by sensing current in switch 52a or switch 52b, and provide a feedback path 58 to a combiner 61. The combiner 61 combines the feedback signal with a compensation ramp on line 63. The output of the combiner 61 provides an input to the inverting input of an amplifier 59. The amplifier 59 receives at its non-inverting input an output from an amplifier 60. The amplifier 59 generates the control signal on line 56.

The outer voltage control feedback loop provides a voltage feedback path 62 from the second terminal of the inductor 28b, where it connects to the inductor 28a and capacitor 28c. The feedback path provides a feedback signal to an inverting input of the amplifier 60. The amplifier 60 receives the low frequency path signal on line 16 at its non-inverting input.

Inductor 28b behaves as a current source due to the action of the inner current feedback loop provided by feedback path 58. A compensation ramp is provided on line 63 in this inner current feedback loop, and is used to prevent frequency halving at high duty cycles.

The outer voltage feedback loop provided by feedback path 62 is used to control the voltage at the junction of inductor 28b, inductor 28a, and capacitor 28c.

The peak-current-mode buck-converter as illustrated in FIG. 3 operates, in general, as follows.

The low pass filter 18 generates a signal representing low frequency variation in the reference signal. This signal on line 16 then comprises a control signal for the pulse signal for the buck switcher, comprising switches 52a and 52b, which has a duty cycle determined by the control signal, such that the voltage at the output of the buck switcher tracks the signal on line 16, i.e. the low frequency variation in the reference signal.

In addition, however, this control signal on line 16 is modified by the inner feedback control loop and the outer feedback voltage control loop.

The outer feedback voltage control loop firstly adjusts the control signal in amplifier 60. The control signal (i.e. the low frequency reference signal) has the feedback signal on feedback path 62 removed therefrom. The feedback voltage on feedback path 62 represents the voltage at the output of the low frequency path, and the removal of this voltage from the low frequency signal on line 16 provides a signal representing the error between the output voltage and the reference voltage.

The inner feedback control loop secondly adjusts the control signal in amplifier 59. The second adjusted control signal (output from amplifier 59) has the signal on feedback path 58 removed therefrom. The feedback signal on feedback path 58 represents the output current.

The output voltage of the supply modulator 22 is provided by a buck switcher formed of the switches 52a, 52b connected to a battery supply voltage Vbat. The linear correction path is added to the buck switcher output, to provide high frequency correction to the low frequency output, via the AC coupling capacitor 30a. As a result of combining with the correction voltage, the modulated supply is hence capable of providing short term output voltages on line 32 which are higher than the supply voltage Vbat. However the average output voltage on line 32 can be no larger than Vbat.

There are some circumstances in which having an average output voltage which cannot exceed the supply (battery) voltage may be a problem. For example, this may be a problem when operating with a depleted battery with a low peak-to-average-power ratio (PAPR) signal, as the average output voltage may then need to be higher than the battery voltage. Hence it is desirable for the switched mode power supply 22 to be capable of both buck and boost operation, to boost the average output voltage to a level above the battery voltage Vbat.

It is well known in the art that conventional boost mode converters are difficult to stabilise on account of a right-half-plane (RHP) zero in their response characteristic. This results in such converters exhibiting a much lower closed loop bandwidth for a given switching frequency than a buck converter. Most prior art converters incorporating boost capability suffer from this disadvantage.

The invention addresses the prior art problems by providing a voltage supply stage comprising an input supply voltage. A first and a second switch are connected in series, the first and second series connected switches being connected in parallel with the input voltage source. A third switch and capacitor are connected in parallel with the first switch. A fourth switch is connected between the connection of the third switch and the capacitor and an output. A fifth switch is connected between the output and electrical ground. In a first phase of operation, the first and fourth switches are closed, and the second, third and fifth switches are open. In a second phase of operation the second, third and fifth switches are closed, and the first and fourth switches are open. The duty cycle of operating phases is controlled such that the average voltage on the output varies between 0 volts and twice the input supply voltage. This is now described more fully with reference to the following Figures.

Figure 4:
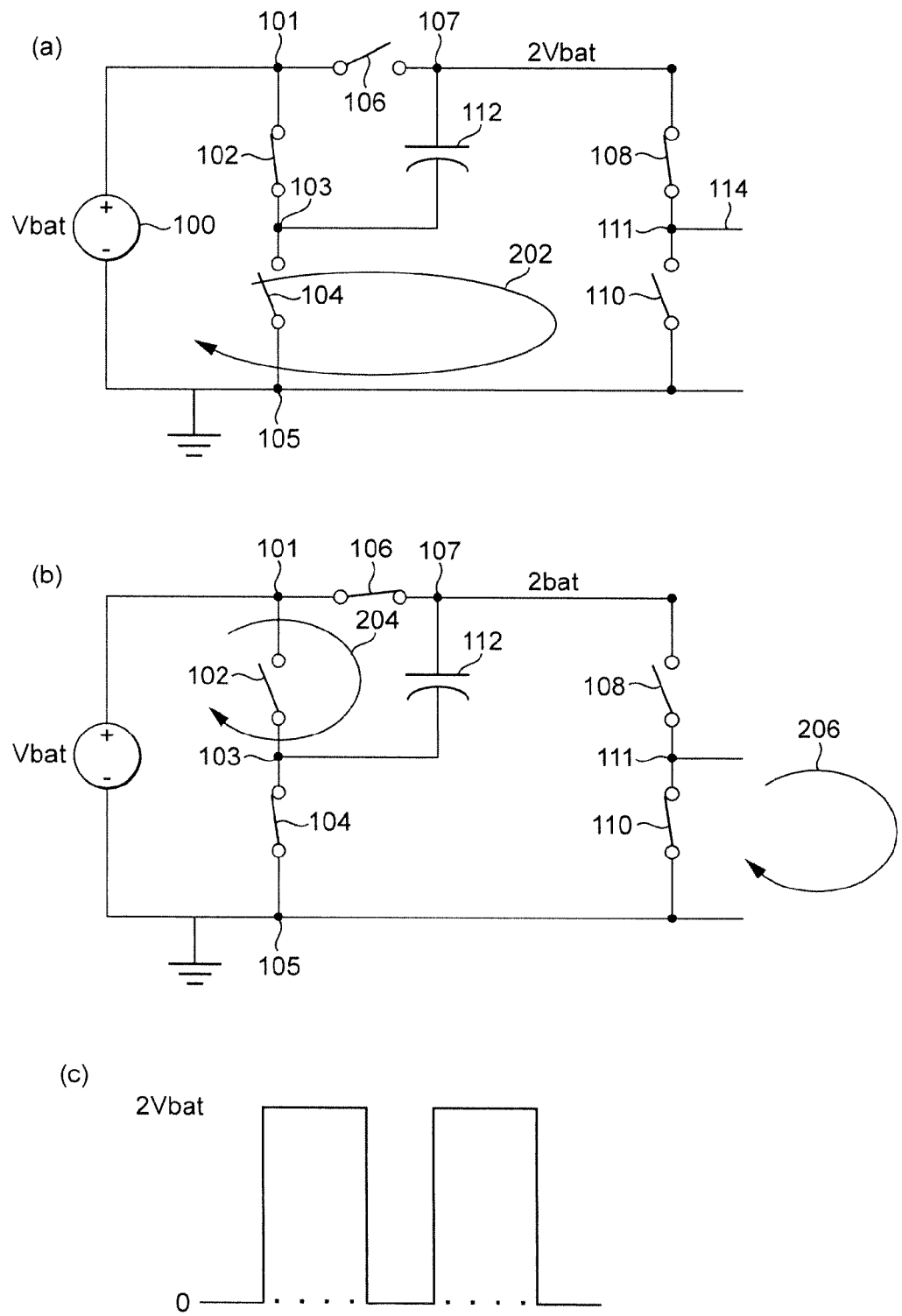
FIGS. 4(a) and 4(b) illustrate a buck and boost switched mode voltage supply in accordance with an embodiment of the invention.
FIG. 4(c) illustrates a voltage waveform generated by the switched mode voltage supply of FIGS. 4(a) and 4(b)

FIGS. 4(a) and 4(b) illustrate a switched capacitor voltage doubler cascaded with a buck output stage in which all switches are synchronously driven, in accordance with an embodiment of the invention. This embodiment shares the same control characteristics as a conventional buck converter but does not suffer from the bandwidth limitations suffered by most boost and buck-boost converter topologies. The exemplary arrangements include a battery for providing the input voltage source.

The buck output stage in FIGS. 4(a) and 4(b) comprises a battery 100, switches 102, 104, 106, 108, 110, and a capacitor 112. The battery 100 is connected between nodes 101 and 105. The switch 102 is connected between nodes 101 and 103. The switch 104 is connected between node 103 and node 105. The switch 106 is connected between nodes 101 and 107. The capacitor 112 is connected between nodes 103 and 107. The switch 108 is connected between node 107 and node 111. The switch 110 is connected between node 105 and node 111. Node 105 is connected to electrical ground. Node 111 is connected to an output line 114 on which the output voltage is generated.

FIG. 4(a) shows the operation in a first phase (phase 1) of the switching cycle, and FIG. 4(b) shows the operation in a second phase (phase 2) of the switching cycle.

In the first phase of operation, as shown in FIG. 4(a), the switches 102 and 108 are closed, and the switches 104, 106 and 110 are open. The arrow 202 denotes current flow in the arrangement of FIG. 4(a).

In the second phase of operation, as shown in FIG. 4(b), the switches 104, 106 and 110 are closed, and the switches 102 and 108 are open. The arrows 204 and 206 denote current flow in the arrangement of FIG. 4(b).

A controller, which is not shown in FIGS. 4(a) and 4(b), controls the switching between the first and second phases of operation. By controlling the switching between the first and second phases of operation, and the duration for which each phase is active (i.e. the duty cycle), the supply voltage can vary between zero volts and twice the battery voltage.

The supply rail to the output buck switches 108, 110 at node 107 varies between voltages Vbat and 2×Vbat, but the average output voltage of this stage can be set to any value between 0V and 2Vbat depending on the waveform duty cycle.

As shown in FIG. 4(c) the output voltage on line 114 comprises a pulse which switches between 0V and 2×Vbat. The duty cycle of switching between the first and second phases can be varied to provide a desired average voltage between 0 volts and 2×Vbat The topology of FIGS. 4(a) and 4(b) does not exhibit a right-half-plane zero and hence does not suffer the problems of the prior art and is capable of high closed loop bandwidth.

FIG. 5(a) shows an extension of the principle described with reference to FIGS. 4(a) and 4(b) to provide a two output buck-boost converter capable of outputting two output voltages each having values between 0 volts and 2×Vbat.

As illustrated in FIG. 5(a), the circuit of FIGS. 4(a) and 4(b) is extended to include further switches 116 and 118. Switch 116 is connected between node 105 and a node 113. Switch 118 is connected between nodes 107 and 113. Node 113 is connected to an output line 115 on which a second output voltage is generated, the output voltage on line 114 now being referred to as a first output voltage.

Figure 5:
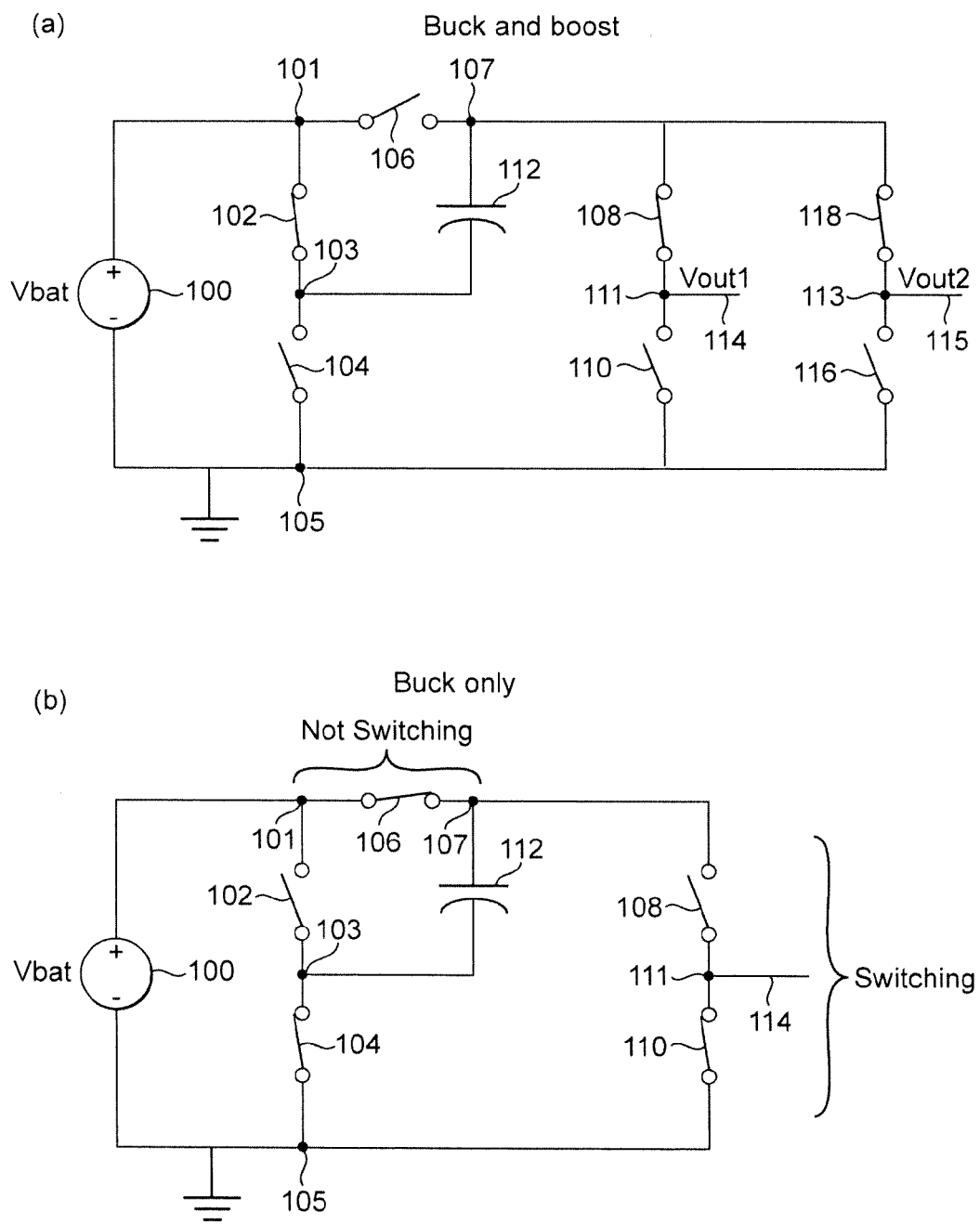
FIGS. 5(a) and 5(b) illustrate a buck and boost switched mode voltage supply in accordance with a further embodiment of the invention.
FIGS. 5(c) and 5(d) illustrate voltage waveforms which may be simultaneously generated in a dual-output buck and boost switched mode voltage supply according to the embodiment of FIG. 5(a)
Figure 5:
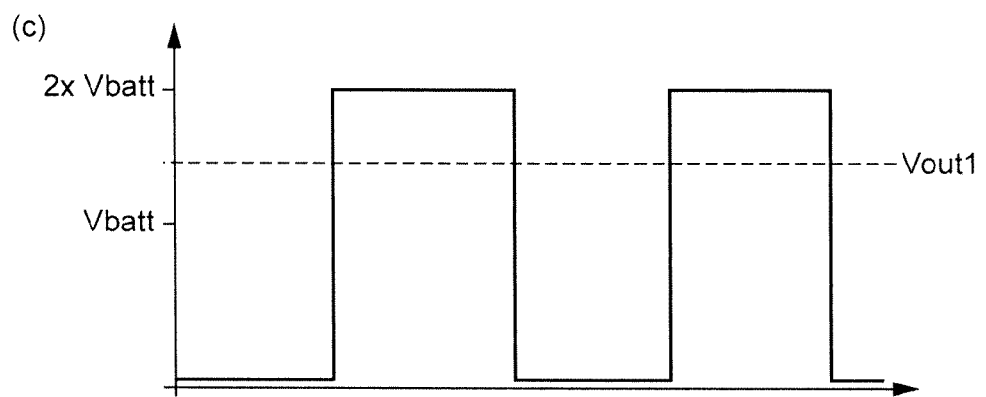
Figure 5:
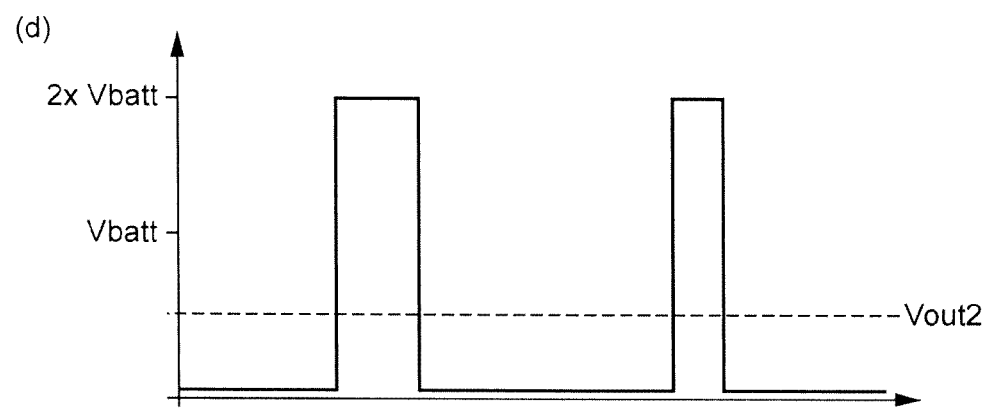

In a buck and boost operation the circuit of FIG. 5 may be controlled similar to the control of the circuit in FIGS. 4(a) and 4(b). FIG. 5 shows the switches in a first phase of operation, consistent with FIG. 4(a). In a second phase of operation the switches of FIG. 5 may be switched to the positions shown in FIG. 4(b), with switch 118 open and switch 116 closed. Different voltages are achieved for the first and second voltages by controlling the duty cycle of the switch pairs 108/110 and 118/116 independently. A lower voltage output is produced by curtailing the pulse width of the lower voltage buck output stage.

The arrangement of the switches in FIG. 5(b) illustrates a buck only mode of operation, in which the output voltage may only vary between 0V and Vbat. In this mode, switches 106 and 104 are permanently closed, and switch 102 is permanently open. Switches 108 and 110 are toggled in first and second phases of operation to vary the duty cycle of the output waveform and achieve an average voltage between 0 volts and Vbat.

Thus if a boost operation is not required, the switched capacitor doubler can be set to a fixed 'through' mode as shown in FIG. 5(b), with only switching between 0 and Vbat occurring in the buck output stage, thereby reducing losses associated with both stages.

If a peak-current-mode control switcher is used as the switched mode amplifier 22 in the low frequency path, an exemplary implementation of which is illustrated in FIG. 3, the loop dynamics are unaffected by the sudden change of supply rail voltage feeding the buck output stage, as the action of the current feedback is to make the inductor behave as an ideal current source.

FIGS. 5(c) and 5(d) illustrate the generation of two supply voltages in buck-boost operation.

As illustrated in FIG. 5(c), for the first output voltage Vout1 the pulse width modulator controls the switches to maintain a high average voltage, such that in this example the first output voltage Vout1 has an average value higher than Vbat.

As illustrated in FIG. 5(d), for the second output voltage Vout2 the pulse width modulator controls the switches to maintain a lower average voltage, such that in this example the second output voltage Vout2 has an average value lower than Vbat.

Figure 6:
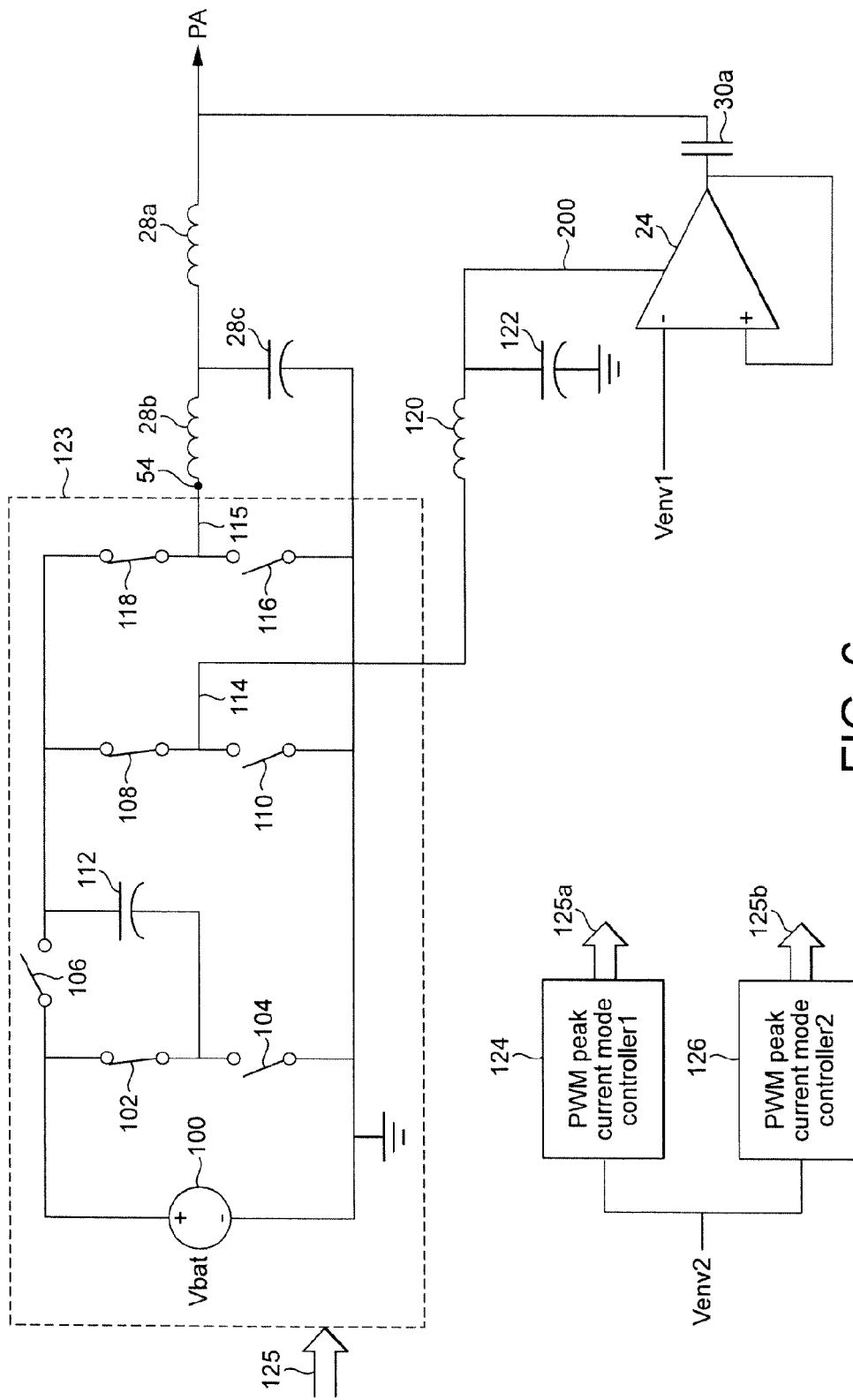
FIG. 6 illustrates the implementation of a dual-output buck and boost switched mode voltage supply according to the embodiment of FIG. 5(a) in an envelope tracking modulated supply architecture according to FIG. 3.

FIG. 6 shows the dual-output buck-boost architecture of 5(a) applied in the advantageous context of an exemplary envelope tracking modulator such as illustrated in FIG. 2. To simplify the illustration, the low frequency path including the pulse width with modulator 50 for controlling the switching of the switcher is not shown in FIG. 6.

The reference numeral 123 denotes the boost-buck switched supply stage of FIG. 5(a), which replaces the switches 52a, 52b of the FIG. 3 arrangement. The arrow 125 denotes the control signal for the switches of the boost-buck switched supply stage, which are provided by a pulse width modulator (such as pulse width modulator 50 of FIG. 3), operating under the control of a signal representing the low frequency variation in the reference signal.

A main supply is provided on the line 115 corresponding to the second output voltage in FIG. 5(a) and is used to provide the low frequency part of the modulator output.

The low frequency voltage output, or switched output voltage, on line 115 is applied to the node 54 as in FIG. 3, and provides the low frequency input to the low frequency combining element comprised of inductor 28a.

A lower power auxiliary supply is provided on line 114 corresponding to the first output voltage in FIG. 5(a), and is used to provide the supply rail to the correction path linear output amplifier 24. The lower power auxiliary supply is provided to the linear amplifier 24 through an inductor-capacitor filter arrangement provided by inductor 120 and capacitor 122, which mirrors the inductor-capacitor filter arrangement provided by inductor 28b and capacitor 28c in the low frequency path.

Figure 1:
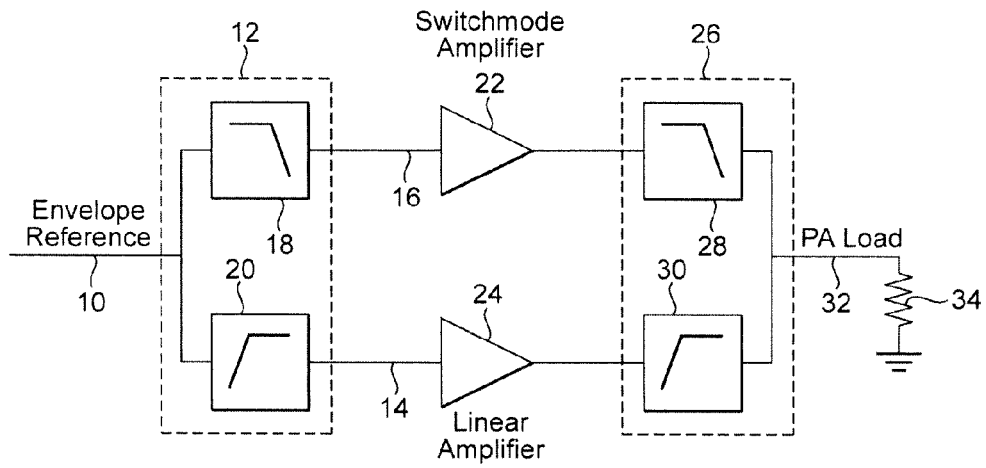
FIG. 1 illustrates a prior art envelope tracking modulated supply with high and low frequency paths.

With reference to FIG. 6 there is illustrated an advantageous arrangement in the correction path in which a feedback path for the linear amplifier 24 is taken directly from the output of the linear amplifier, rather than the output of the combiner. In addition the high pass filter 20 of the FIG. 3 arrangement is eliminated. As a result a full-spectrum representation of the reference signal is provided on the path 14 rather than a signal with low frequency components removed, as in the arrangements of FIGS. 1 and 2. Such an arrangement offers efficiency improvements over the prior art, as it allows the peak-to-peak supply voltage of the linear amplifier 24 to be minimised. Embodiments of the invention are preferably implemented in such an arrangement, although the invention and embodiments are not limited to such an advantageous arrangement. The invention is advantageously applied in such an architecture.

As illustrated further in FIG. 6, two switch controllers are provided: a first PWM peak current mode controller 124 and a second PWM peak current mode controller 126.

Each of the controllers 124 and 126 receive the low frequency reference signal (or envelope signal) as an input, such as the signal on line 16 in FIG. 3 (or a signal derived therefrom). The first P peak current mode controller 124 controls the switches 118 and 116 which are used to produce the switcher output voltage on line 115, and the second PWM peak current controller 126 synchronises in frequency and phase with the first controller controls the switches 108 and 110 which are used to produce the voltage supply for the linear amplifier on line 114. Thus each of P peak mode controllers 124 and 126 is shown to provide general control signals 125a and 125b, which form part of the control signals 125 to the switched supply stage 123.

Voltage doubler switches 102, 104 and 106 are controlled by the PWM waveform of the first or second controller, whichever has the larger duty cycle, to ensure that the input to both half-bridge stages (switches 108, 110 and 118, 116) is 2Vbat when switches 108 or 118 are made. Equivalently, the PWM waveform controlling switches 102, 104 and 106 is a logical 'OR' function of the PWM waveforms of controllers 1 and 2.

The main output supply on line 115 is modulated, whereas the auxiliary output supply—namely the supply voltage to the linear amplifier 24 on line 200—may be a fixed voltage, or a voltage which is set according to the average power of the RF signal on a slot-by-slot basis in a communication system which is time-slot based.

Activation of the boost mode to increase the output voltage to up to double the battery voltage can be controlled directly by a baseband controller, for example on a slot-by-slot basis, depending, for example, on any one or combination of the RF power level, the peak-to-average power ratio, and the battery voltage in a time-slot. The baseband controller can control the P peak current mode controllers 124 and 126.

Figure 7:
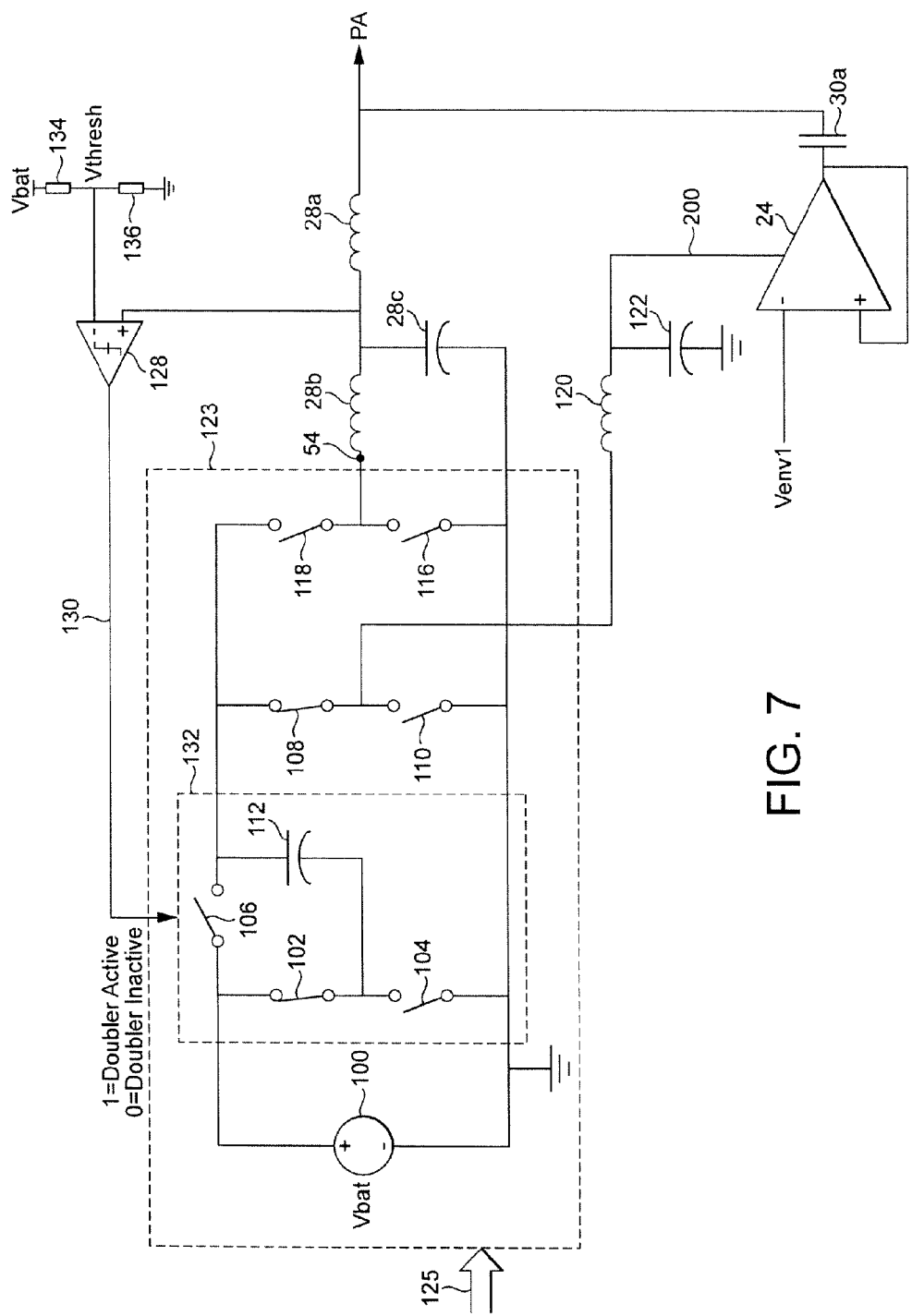
FIG. 7 illustrates the dual-output buck and boost switched mode voltage supply of FIG. 6 with an improvement to provide automatic enablement of the boost mode of operation.

Alternatively, autonomous control of the boost setting may be possible by comparing the switcher output voltage or scaled reference voltage with a threshold voltage which may be defined as a percentage of the current battery voltage as shown in FIG. 7. This reduces the firmware burden on the baseband controller.

With reference to FIG. 7, a comparator 128 is introduced which generates a control signal on line 130 for enabling/disabling the voltage doubling circuitry provided by the switches 104, 102, 106 and the capacitor 112, generally denoted by reference numeral 132.

The comparator 128 is arranged to compare the output voltage at the switched output, detected at the node at the junction of inductors 28a and 28b and provided as a first input to the comparator 128, with a threshold value at the second input to the comparator 128. The threshold voltage is provided at the junction of resistors 134 and 136, the other terminal of resistor 134 is connected to Vbat, and the other terminal of resistor 136 is connected to electrical ground.

If the voltage doubling circuitry 132 is disabled, the output voltages are generated by the respective output stages comprising switched pairs 108/110 and 116/118 as conventional buck stages. This allows the respective output voltages to switch between 0V and Vbat. When enabled, the voltage doubling circuitry 132 allows the respective output voltages to switch between 0V and 2×Vbat.

In dependence on the comparison in the comparator 128, the voltage doubler circuitry 132 is enabled or disabled by control line 130.

Figure 8:
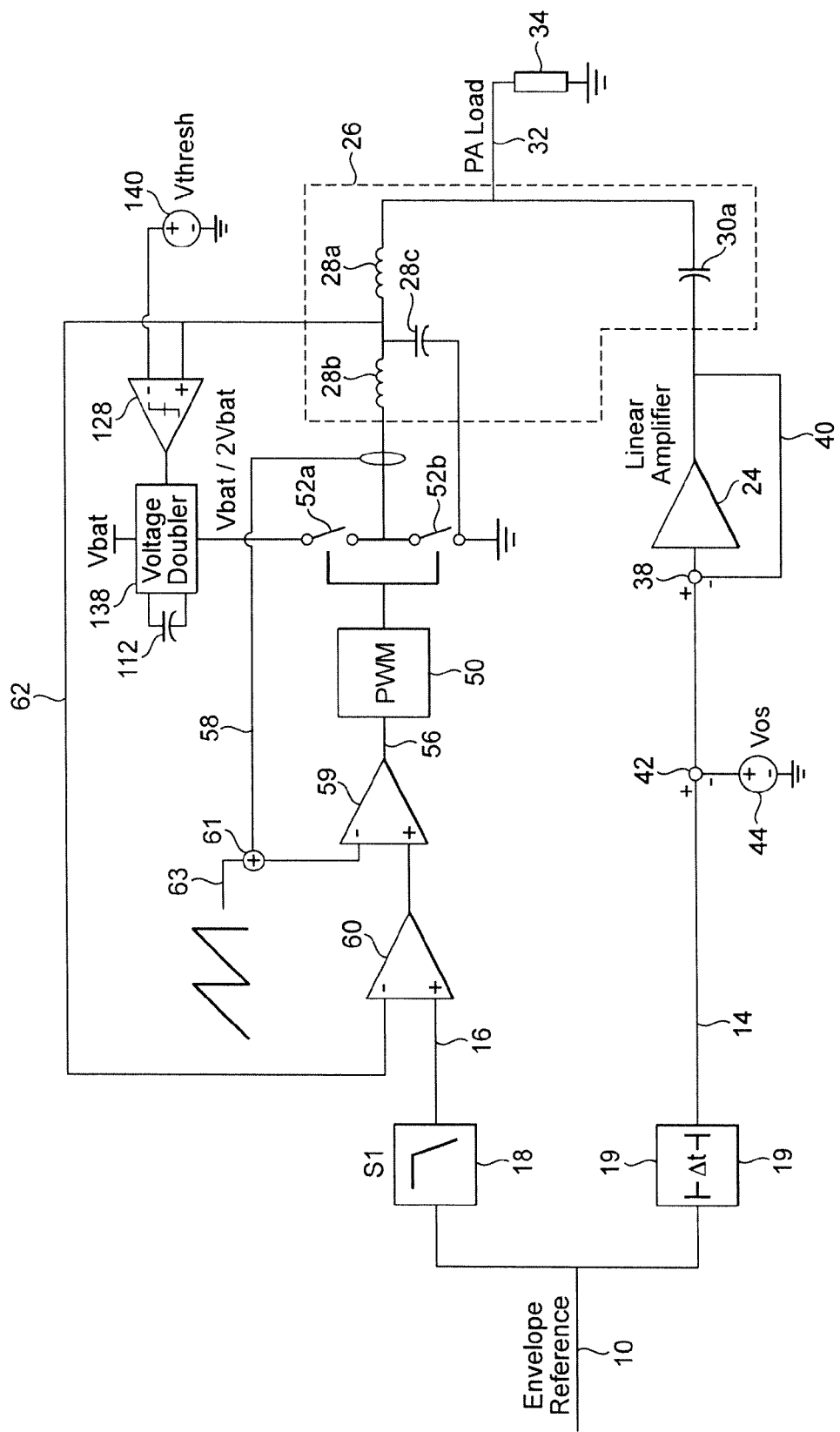
FIG. 8 illustrates an improved envelope tracking modulated supply incorporating a buck and boost switched mode supply according to FIG. 4(a) with the automatic enablement of FIG. 7.

A block level architecture of a an envelope tracking modulated power, including the auto-enabled boost-buck switcher of FIG. 7, is shown in FIG. 8 in the context of an advantageous feedback architecture in the correction path. In FIG. 8 the supply voltage to the linear amplifier is not shown to simplify the illustration, and therefore a dual-output switched supply is not shown. However it will be apparent how the dual mode switched supply of FIGS. 6 and 7 may be utilised in the arrangement of FIG. 8 to provide a supply to the linear amplifier 24.

With further reference to FIG. 8, to maximise efficiency, a DC offset is preferably added to the input signal to allow rail-to-rail operation of the linear amplifier 24. The value of the DC offset voltage is chosen to position the DC voltage at the output of the substractor 42 to allow the lowest possible supply voltage to be used for the linear amplifier 24.

The linear amplifier 24 is preferably always operated with the minimum possible supply voltage, which is provided by an efficient switched mode supply. Preferably the supply voltage to the linear amplifier is provided in accordance with the arrangement of FIG. 7 although this is not shown in FIG. 8.

In FIG. 8 any delay associated with the switcher in the low frequency path may optionally be compensated for using a delay matching element in the high frequency path including the linear amplifier, as denoted by delay element 19.

In FIG. 8 it is shown that the comparator 128 compares a threshold voltage to the output voltage of the low frequency path. However the output voltage of the low frequency path is derived from the low frequency part of reference voltage, and the threshold voltage may be compared to any signal which is derived from the low frequency part of the reference voltage. In the arrangement of FIG. 8, the threshold voltage may be compared to the signal on line 16, rather than the output of the low frequency path, for example.

The invention and its embodiments relates to the application of envelope tracking (ET) to radio frequency (RF) power amplifiers, and is applicable to a broad range of implementations including cellular handsets, wireless infrastructure, and military power amplifier applications at high frequencies to microwave frequencies.

The invention claimed is:

1. A voltage supply stage comprising an input supply voltage, a first and second switch connected in series, the first and second series-connected switches being connected in parallel with the input supply voltage between first and second terminals of the input supply voltage, a third switch and capacitor connected in series, the series-connected third switch and capacitor being connected in parallel with the first switch, a fourth switch connected between the connection of the third switch and the capacitor and an output, and a fifth switch connected between the output and a terminal of the input supply voltage, wherein:
 in a first phase of operation, the first and the fourth switch are closed, and the second, third and fifth switches are open;
 in a second phase of operation, the second, third and fifth switches are closed, and the first and fourth switches are open; and
 a duty cycle of the first and second phases is controlled such that an average voltage on the output varies between 0 volts and twice the input supply voltage.

2. The voltage supply stage of claim 1 wherein the voltage supply stage comprises a peak current mode switcher.

3. The voltage supply stage of claim 1 further comprising a sixth switch connected between the connection of the third switch and the capacitor and a further output, and a seventh switch connected between the further output and the terminal of the input supply voltage, wherein:
 in the first phase of operation, the sixth switch is closed and the seventh switch is open;
 in the second phase of operation, the sixth switch is open and the seventh switch is closed; and
 the duty cycle of the first and second phases is controlled such that the average voltage on the further output varies between 0 volts and twice the input supply voltage.

4. The voltage supply stage of claim 3 in which first, second and third switches are enabled and disabled with the fourth and fifth switches or the sixth and seventh switches.

5. The voltage supply stage of claim 1 wherein in a buck only mode of operation the second and third switches are closed and the first switch is opened in both the first and second phases of operation, and the duty cycle of the remaining switches in the first and second phases of operation is controlled such that the average voltage on the output and/or the further output varies between 0 volts and the input supply voltage.

6. The voltage supply stage of claim 5 wherein there is provided a control signal for enabling and disabling the buck mode of operation.

7. The voltage supply stage of claim 6 further comprising circuitry for comparing one of the output or the further output or the low frequency reference signal to a threshold level, and setting or resetting the control signal in dependence thereon.

8. An envelope tracking modulated supply arranged to generate a modulated supply voltage in dependence on a reference signal, comprising a low frequency path for tracking low frequency variations in the reference signal and including a switched mode power supply including a voltage supply stage according to claim 1, a correction path for tracking high frequency variations in the reference signal and including a linear amplifier, and a combiner for combining the output of the switched mode power supply and the output of the linear amplifier to generate a modulated supply voltage.

9. The envelope tracking modulated supply of claim 8 wherein there is provided a feedback path from an output of the linear amplifier to an input of the linear amplifier, such that the linear amplifier in the correction path amplifies a signal comprising a full spectrum of the frequencies in the reference signal.

10. The envelope tracking modulated supply of claim 8 wherein a further output provides a power supply of the correction path.

11. The envelope tracking modulated supply of claim 8 wherein the low frequency path comprises a peak current mode switcher.

12. An RF amplifier including a voltage supply stage of claim 1.

13. A wireless communication system including a voltage supply stage of claim 1.

14. A wireless mobile device including a voltage supply stage of claim 1.

\* \* \* \* \*